(12) United States Patent
Jung et al.

(10) Patent No.: US 6,395,451 B1
(45) Date of Patent: May 28, 2002

(54) PHOTORESIST COMPOSITION CONTAINING PHOTO BASE GENERATOR WITH PHOTO ACID GENERATOR

(75) Inventors: Jae Chang Jung, Kyoungki-do; Keun Kyu Kong, Kwangju; Jin Soo Kim, Taejon-shi; Ki Ho Baik, Kyoungki-do, all of (KR)

(73) Assignee: Hyundai Electronics Industries Co., Ltd. (KR)

( * ) Notice: Subject to any disclaimer, the term of this patent is extended or adjusted under 35 U.S.C. 154(b) by 0 days.

(21) Appl. No.: 09/666,932

(22) Filed: Sep. 21, 2000

(30) Foreign Application Priority Data

Sep. 21, 1999 (KR) ............................................. 99-40534

(51) Int. Cl.$^7$ .............................................. G03F 7/004
(52) U.S. Cl. .................... 430/270.1; 430/326; 430/914; 430/919
(58) Field of Search .............................. 430/270.1, 919, 430/326, 914

(56) References Cited

U.S. PATENT DOCUMENTS

| | | | |
|---|---|---|---|
| 5,650,261 A | * 7/1997 | Winkle | 430/270.1 |
| 5,707,776 A | 1/1998 | Kawabe et al. | 430/270.1 |
| 5,928,818 A | * 7/1999 | Mertesdorf et al. | 430/18 |
| 5,942,367 A | 8/1999 | Watanabe et al. | 430/170 |

FOREIGN PATENT DOCUMENTS

| | | |
|---|---|---|
| EP | 0 425 142 A2 | 5/1991 |
| EP | 0 952 489 A1 | 10/1999 |
| JP | 2-269350 | 11/1990 |
| JP | 2-296250 | 12/1990 |
| JP | 4-362642 | 12/1992 |
| JP | 10-77257 | 3/1998 |
| JP | 10-83079 | 3/1998 |
| JP | 11-295895 | 10/1999 |
| JP | 2000-10270 | 1/2000 |

OTHER PUBLICATIONS

Translation of JP 2–296250, Dec. 1990.*
Japan Abstract Publication No. 02118650, dated May 1990 (in English).
WPI Abstract No. JP 110295895A.
WPI Abstract No.JP 100077257 A.
WPI Abstract No. JP 100083079 A.
Masamitsu Shirai et al., "Photoacid and Photobase Generators: Chemistry and Applications to Polymeric Materials," *Prog. Polym. Sci*, vol. 21, 1996, pp. 1–45.

* cited by examiner

Primary Examiner—Rosemary Ashton
(74) Attorney, Agent, or Firm—Townsend and Townsend and Crew LLP

(57) ABSTRACT

The present invention relates to a photoresist composition containing Photo Base Generator (PBG), more specifically, to a photoresist composition which comprises (a) photoresist resin, (b) photo acid generator, (c) organic solvent and further (d) photo base generator. The photo base generator is preferably selected from benzyloxycarbonyl compound of Chemical Formula 1 or O-acyloxime compound of Chemical Formula 2, which prevents a slopping pattern formation and a severe I/D Bias occurrence.

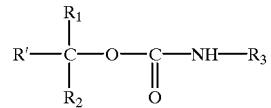

<Chemical Formula 1>

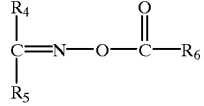

<Chemical Formula 2> wherein, R', $R_1$ to $R_6$ are defined in accordance with the Specification.

17 Claims, 4 Drawing Sheets

PHOTORESIST COMPOSITION CONTAINING PHOTO BASE GENERATOR WITH PHOTO ACID GENERATOR

BACKGROUND OF THE INVENTION

1. Field of the Invention

The present invention relates to a photoresist composition containing a photo base generator (abbreviated as "PBG"). In particular, the invention relates to a photoresist composition comprising (a) a photoresist resin, (b) a photo acid generator, (c) an organic solvent and (d) a photo base generator. The photo base generator reduces or prevents sloping pattern and I/D Bias due to a higher concentration of acid in the upper portion of the photoresist relative to the concentration of acid in the lower portion of the photoresist.

2. Description of the Background Art

Use of chemical amplification-type photoresists (i.e., photoresist compositions) is currently being investigated in photolithography processes using light source such as KrF, ArF, VUV and EUV to achieve a high sensitivity in a minute image-formation on semiconductor devices. Such photoresist compositions are generally prepared by blending a photoacid generator with a matrix resin polymer (i.e., photoresist polymer or photoresist resin) having an acid labile group.

In a photolithography process, the resolution of an image depends on the wavelength of the light used. Thus, the shorter the wavelength, the higher the resolution, i.e., shorter wavelengths allow smaller pattern formation.

In order to be useful in a photolithography process, a photoresist composition must have an excellent etching resistance, heat resistance, and adhesiveness. Moreover, to reduce the cost of manufacturing semiconductor devices, a photoresist composition should be capable of being developed by a common developing solution, such as 2.38 wt % aqueous tetramethylammonium hydroxide (TMAH) solution. These qualities are particularly important in photolithography processes utilizing a deep ultraviolet light source (i.e., short wavelength light source), including KrF (248 nm), ArF (193 nm), VUV (157 nm) and EUV (13 nm).

However, it is very difficult to synthesize a photoresist composition that satisfies all of these requirements. For example, a photoresist polymer having a polyacrylate backbone is readily available, but it has poor etching resistance and is difficult to develop.

Etching resistance may be improved by adding alicyclic unit to the photoresist polymer; however, the presence of alicyclic unit in the photoresist polymer creates problems during the process for manufacturing semiconductor elements. For example, sloping pattern is formed when photoresist resin comprising the alicyclic units is used. Without being bound by any theory, it is believed that the sloping pattern formation is a result of having more light exposure on the upper portions of the PR composition relative to the lower portion of the PR composition (see FIG. 1). It is believed that the higher light exposure on the upper portions is due to an aerial image of the PR composition (or absorption of light by the resin). Other problems include a severe CD difference between isolated lines and dense lines (i.e., I/D bias) (see FIGS. 2 and 3).

The present inventors have found that when a PR composition is exposed to the same amount of light energy, there was more energy around the isolated lines of FIG. 2 than the dense lines of FIG. 3. Moreover, it was found that the acid concentration around the isolated lines was generally significantly higher than areas near the dense lines. This acid concentration gradient causes the acid to diffuse relatively easily resulting in narrower isolated lines relative to the dense lines when the PR composition is exposed to the same amount of light energy.

Therefore, there is a need for a photoresist composition which overcomes the above-mentioned disadvantages.

SUMMARY OF THE INVENTION

An object of the present invention is to provide photoresist compositions which significantly reduce or prevent the formation a sloping pattern (and hence a severe I/D bias occurrence) due to a higher concentration of generated acid in the upper portions of the photoresist composition relative to the lower portions of the photoresist composition.

Another object of the present invention is to provide a semiconductor element produced by using the Photoresist composition.

DETAILED DESCRIPTION OF THE INVENTION

Figure 1:
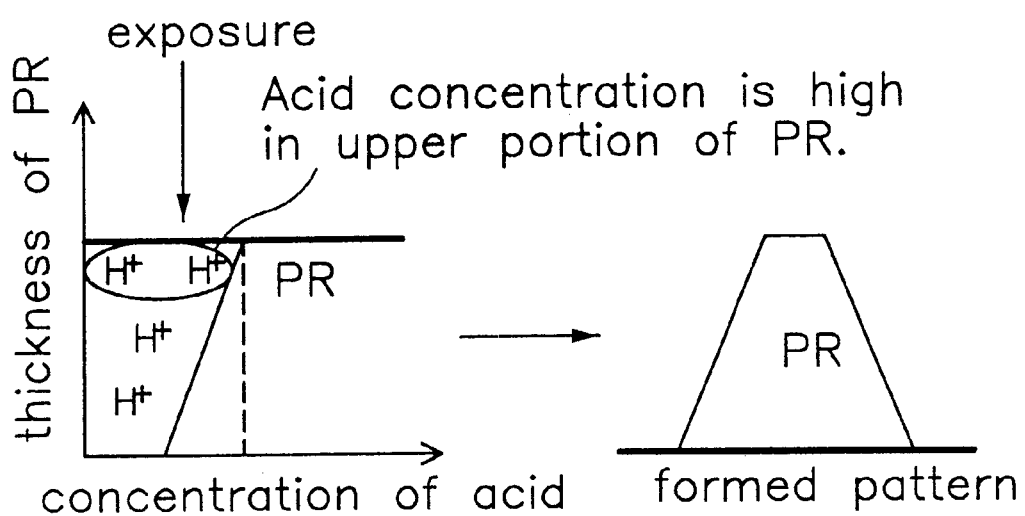
FIG. 1 is a cross sectional view of the pattern formation when a photoresist composition (i.e., PR) containing photo acid generator (PAG) without photo base generator (PBG) is used.
Figure 2:
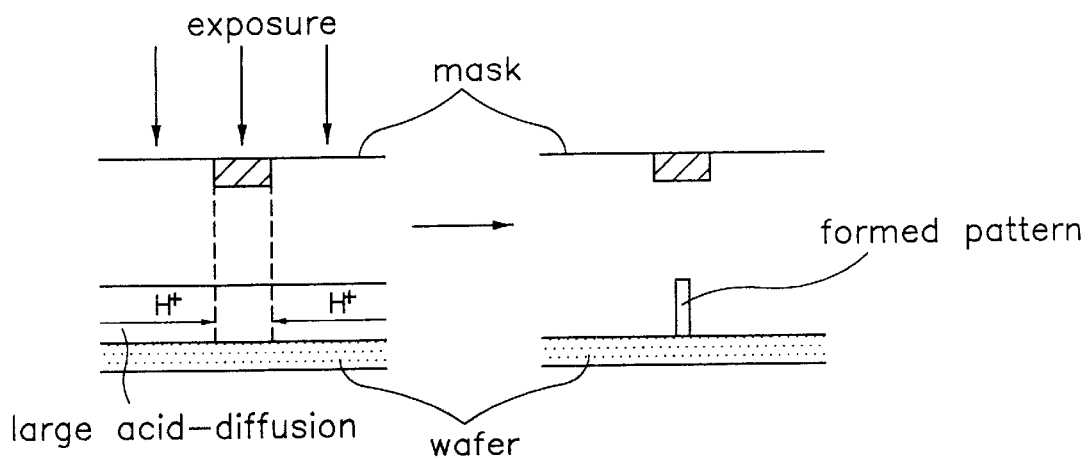
FIG. 2 is a cross sectional view of the isolated line pattern formation when a PR containing PAG without PBG is used.
Figure 3:
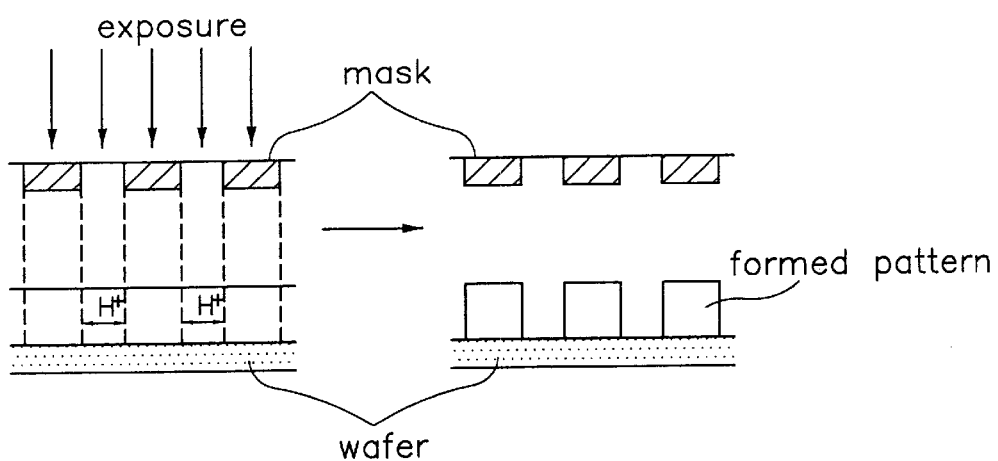
FIG. 3 is a cross sectional view of the dense line pattern formation when a PR containing PAG without PBG is used.

The present invention provides a photoresist composition comprising (a) a photoresist resin, (b) a photo acid generator, (c) a photo base generator and (d) an organic solvent.

The photo base generator for the present invention is preferably selected from a group consisting of compounds of Chemical Formula I and compounds of Chemical Formula 2. However, other kinds of photo base generator, such as those described in Prog. Polym. Sci., Vol. 21, 1–45, 1996, Elsevier Science Ltd., which is incorporated herein by reference in its entirety, can also be used.

<Chemical Formula 1>

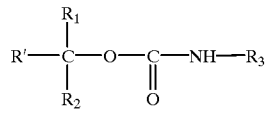

<Chemical Formula 2>

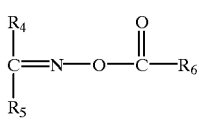

wherein,

R' is an aryl, preferably a phenyl, substituted with one or two nitro groups, preferably at the ortho positions;

$R_1$ and $R_2$ are independently hydrogen or optionally substituted linear or ranched ($C_1$-$C_{10}$) alkyl;

$R_3$ is optionally substituted linear or branched ($C_1$-$C_{20}$) alkyl, optionally substituted ($C_3$-$C_{20}$) cycloalkyl, or optionally substituted ($C_6$-$C_{20}$) aryl;

$R_4$ and $R_5$ are independently hydrogen, optionally substituted linear or ranched ($C_1$-$C_{20}$) alkyl; or optionally substituted ($C_6$-$C_{20}$) aryl; and $R_6$ is hydrogen, optionally substituted linear or branched ($C_1$-$C_{20}$) alkyl; or optionally substituted ($C_6$-$C_{20}$) aralkyl.

"Alkyl" means a linear or branched saturated monovalent hydrocarbon radical, e.g., methyl, ethyl, propyl, 2-propyl, n-butyl, iso-butyl, tert-butyl, pentyl, and the like.

"Aryl" means a monovalent monocyclic or bicyclic aromatic hydrocarbon radical.

"Cycloalkyl" refers to a saturated monovalent cyclic hydrocarbon radical, e.g., cyclopropyl, cyclobutyl, cyclohexyl, 4-methylcyclohexyl, and the like.

"Alkylene" means a linear saturated divalent hydrocarbon radical or a branched saturated divalent hydrocarbon radical, e.g., methylene, ethylene, 2,2-dimethylethylene, propylene, 2-methylpropylene, butylene, pentylene, and the like.

"Aralkyl" means a radical—$R^aR^b$ where $R^a$ is an alkylene group and $R^b$ is aryl group as defined herein, e.g., phenylmethyl (i.e., benzyl) and the like.

The compound of Chemical Formula 1 is preferably selected from a group consisting of the compounds of Chemical Formulas 1a to 1f:

<Chemical Formula 1a>

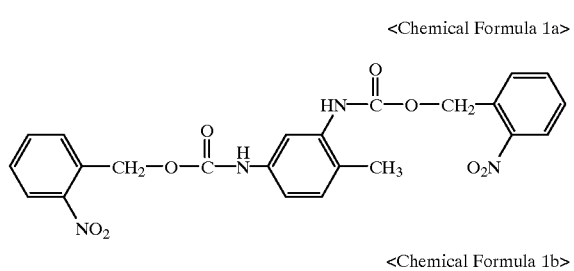

<Chemical Formula 1b>

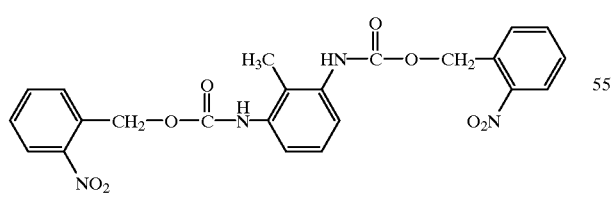

<Chemical Formula 1c>

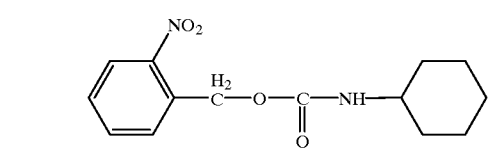

<Chemical Formula 1d>

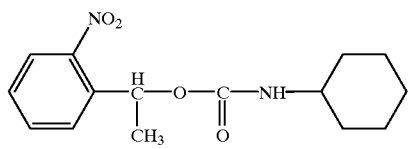

<Chemical Formula 1e>

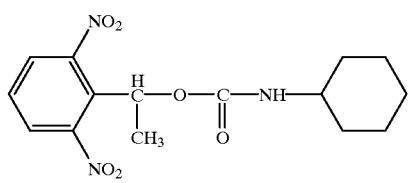

<Chemical Formula 1f>

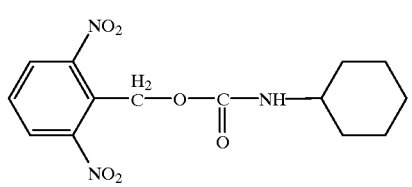

The compound of Chemical Formula 2 is preferably selected from a group consisting of the compounds of Chemical Formulas 2a to 2c.

<Chemical Formula 2a>

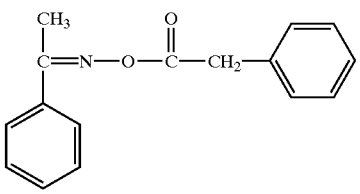

<Chemical Formula 2b>

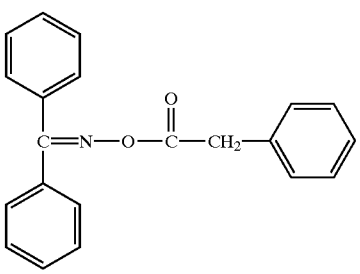

<Chemical Formula 2c>

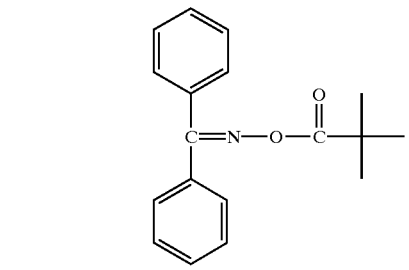

The compound of Chemical Formula 1 can be prepared by reacting the compound of Chemical Formula 3 and the compound of Chemical Formula 4.

<Chemical Formula 3>

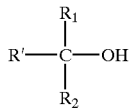

<Chemical Formula 4>

R$_3$—N=C=O wherein, R', R$_1$, R$_2$ and R$_3$ are those defined above.

For example, the above compound of Chemical Formula 1a can be prepared by reacting the compound of Chemical Formula 3a and the compound of Chemical Formula 4a. And the compound of Chemical Formula 1b can be prepared by reacting the compound of Chemical Formula 3a and the compound of Chemical Formula 4b.

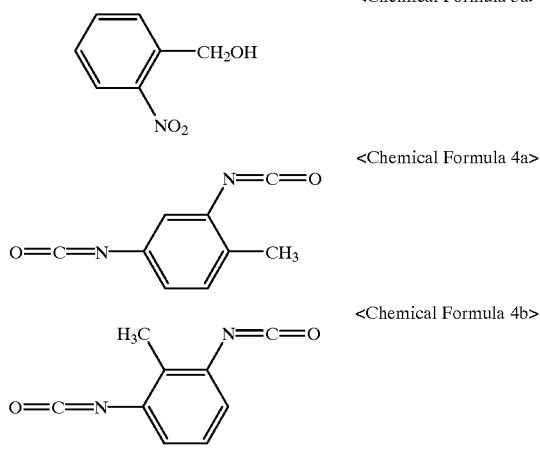

<Chemical Formula 3a>

<Chemical Formula 4a>

<Chemical Formula 4b>

Preferred photoacid generators include sulfide and onium type compounds. In one particular embodiment of the present invention, the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate. Typically, the amount of photoacid generator used is in the range from about 0.05% by weight to about 10% by weight of the photoresist resin present in the composition.

The amount of compound of photo base generator present in the photoresist composition is preferably in the range from about 30% by weight to about 150% by weight of the photoacid generator.

While a variety of organic solvents are suitable for use in the photoresist composition of the present invention, preferably the organic solvent selected from the group consisting of methyl 3-methoxypropionate, ethyl 3-ethoxypropionate, propylene glycol methyl ether acetate (PGMEA), cyclohexanone and 2-heptanone. The amount of organic solvent used in the photoresist composition is preferably from about 200% by weight to about 800% by weight of the photoresist resin.

The photoresist resin can be any currently known chemically amplified photoresist resin, including a resin of Chemical Formula 5:

<Chemical Formula 5>

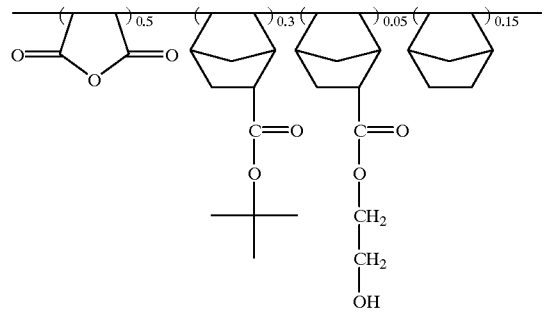

Another embodiment of the present invention provides a process for producing a photoresist pattern comprising the steps of:
(a) coating a photoresist composition described above on a substrate to form a photoresist film;
(b) exposing the photoresist film to light by using an exposer; and
(c) developing the exposed photoresist film.

The process for producing the photoresist pattern can also comprise heating (e.g., baking) step(s) before and/or after exposing the photoresist film to light. The baking step is typically performed at temperature of about 70° C. to about 200° C.

As used herein, the term "light" refers to an electromagnetic wave generated by the exposer and not by an ambient light source, unless otherwise stated. Preferably, the exposer is a short wavelength light source such as ArF, KrF, VUV, EUV, E-beam, X-ray, ion beam, or combinations thereof. The exposure energy is preferably from about 1 mJ/cm$^2$ to about 100 mJ/cm$^2$.

Yet another embodiment of the present invention provides semiconductor element manufactured using the photoresist compositions described above.

Figure 4:
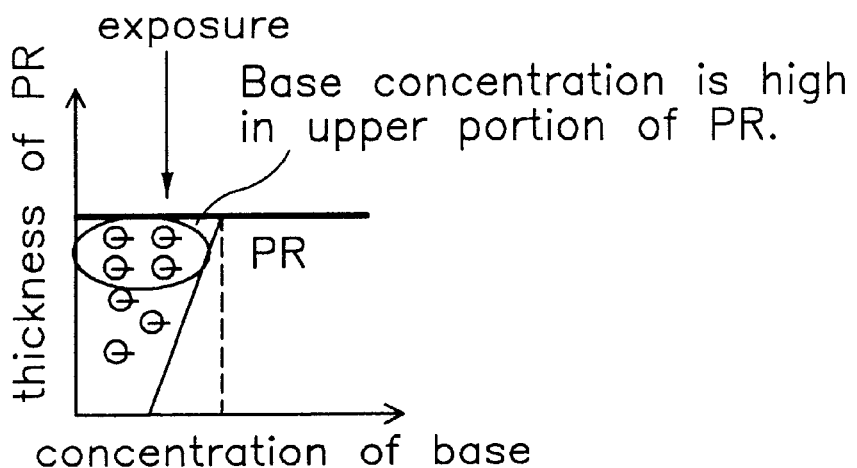
FIG. 4 is a cross sectional view that shows much base is generated in the upper portion of the PR when a PR containing PBG is used.
Figure 5:
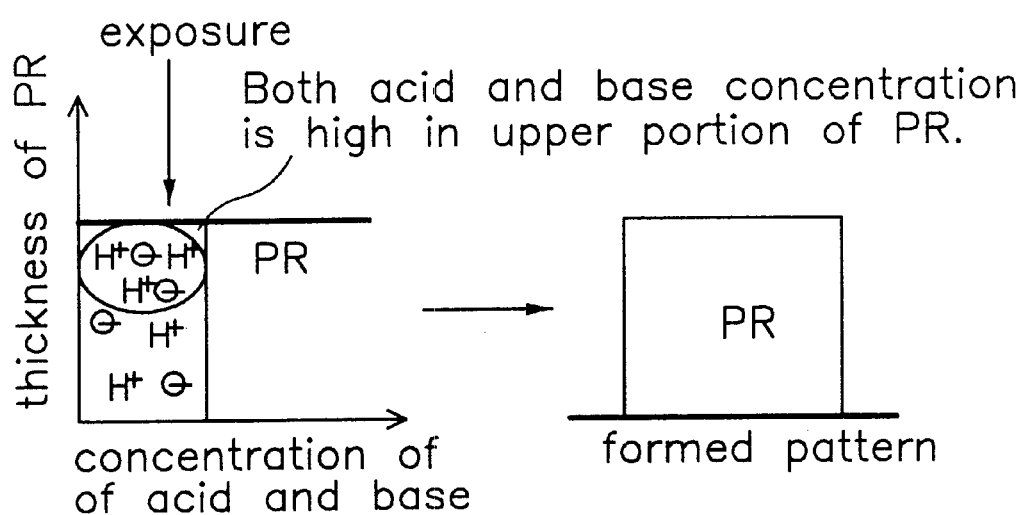
FIG. 5 is a cross sectional view that shows both acid and base are generated abundantly in the upper portion of the PR when a PR containing PBG and PAG is used.

When a pattern is formed by using photoresist compositions of the present invention containing photo base generator, the base which is generated heavily on the upper portion of photoresist layer neutralizes some of the acids that are also generated heavily on the upper portion of photoresist layer. This neutralization prevents or reduces the formation of slopping patterns (see FIGS. 4 and 5), and decreases the I/D bias.

The present invention will now be described in more detail by referring to the examples below, which are not intended to be limiting.

EXAMPLE 1

Preparation of Photo Base Generator of Chemical Formula 1a

To 200 mL of tetrahydrofuran (THF) was added 0.2 mole (30.6 g) of the compound of Chemical Formula 3a and 0.1 mole (17.4 g) of diisocyanate compound of Chemical Formula 4a. The reaction mixture was stirred for 10 hours, after which the precipitate was filtered and dried to obtain the photo base generator of Chemical Formula 1a.

EXAMPLE 2

Preparation of Photo Base Generator of Chemical Formula 1b o 200 mL of tetrahydrofuran (THF) was added 0.2 mole (30.6 g) of the compound of Chemical Formula 3a and 0.1 mole (17.4 g) of diisocyanate compound of Chemical Formula 4b. The reaction mixture was stirred for 3 days, after which some of the solvent was removed by an evaporator. Water was added and the resulting precipitate was filtered dried to obtain the photo base generator of Chemical Formula 1b.

COMPARATIVE EXAMPLE

To 110 g of 2-heptanone was added 20 g of the polymer of Chemical Formula 5 and 0.24 g of triphenylsulfonium triflate. The resulting mixture was filtered through a microfilter.

Figure 6:
FIG. 6 shows a pattern obtained when a PR containing PAG without PBG is used.

The photoresist composition thus prepared was spin-coated on a silicon wafer, and soft-baked in an oven or hot plate of 140° C. for 90 seconds. After baking, the photoresist was exposed to light using an ArF laser exposer, and then post-baked at 140° C. for 90 seconds. When the post-baking was completed, it was developed in 2.38 wt % aqueous TMAH (tetramethylammonium hydroxide) solution to obtain a sloping pattern (See FIG. 6).

The CD difference between isolated line and dense line is shown in the following Table 1.

EXAMPLE 3

Preparation of Photoresist Composition and Formation of Pattern

To 110 g of 2-heptanone was added 20 g of the polymer of Chemical Formula 5, 0.24 g of triphenylsulfonium triflate, and 0.096 g of the compound of Chemical Formula 1a. The resulting mixture was filtered through a micro-filter.

The photoresist composition thus prepared was spin-coated on a silicon wafer, and soft-baked in an oven or hot plate of 140° C. for 90 seconds. After baking, the photoresist was exposed to light using an ArF laser exposer, and then post-baked at 140° C. for 90 seconds. When the post-baking was completed, it was developed in 2.38 wt % aqueous TMAH (tetramethylammonium hydroxide) solution to obtain a 0.13 μm L/S pattern (See FIG. 7).

The CD difference between isolated line and dense line is shown in the following Table 1.

TABLE 1

| PR composition Criterion: 150 nm | PR composition without using PBG | PR composition using PBG (Example 3) |
|---|---|---|
| I/D Bias | 60 nm | 14 nm |

EXAMPLE 4

Preparation of Photoresist Composition and Formation of Pattern

The procedure of Example 3 was repeated except the photo base generator of Chemical Formula 1b was used instead of the photo base generator of Chemical Formula 1a to prepare the photoresist composition and to obtain the pattern.

Figure 7:
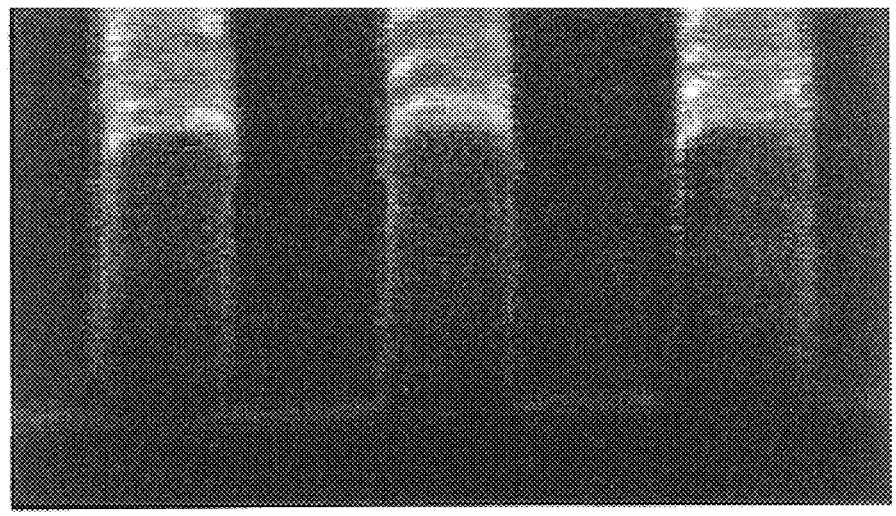
FIG. 7 is a picture of the pattern obtained when a PR containing both PAG and PBG is used.

As shown above, relative to photoresist compositions having no photo base generator, photoresist compositions containing a photo base generator improve the slopping pattern (FIG. 6) by producing a substantially perpendicular pattern (FIG. 7). In addition, photoresist compositions containing a photo base generator result in smaller I/D bias relative to photoresist compositions having no photo base generator. Thus, photoresist compositions having a photo base generator are useful for obtaining ultrafine patterns, especially for photolithography employing a short wavelength light source such as, ArF (193 nm).

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g., as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A photoresist composition comprising
   (a) a photoresist polymer having the Chemical Formula 5:

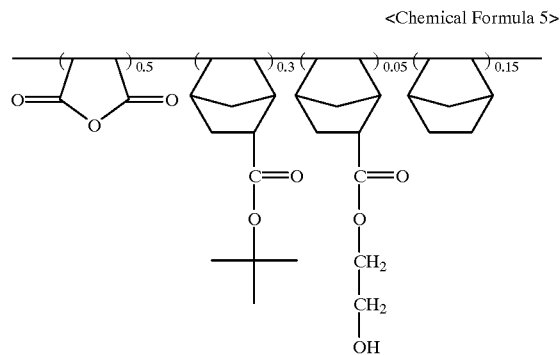

<Chemical Formula 5>

(b) a photoacid generator, (c) a photo base generator, and
   (d) an organic solvent.

2. The photoresist composition according to claim 1, wherein said photo base generator is selected from the group consisting of a compound of Formula 1 and a compound of Formula 2:

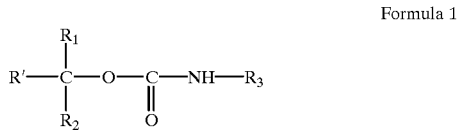

Formula 1

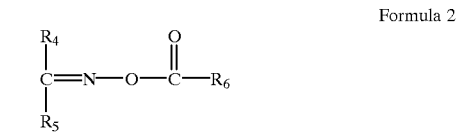

Formula 2 wherein
   R' is an aryl substituted with one or two nitro groups;
   $R_1$ and $R_2$ are independently hydrogen or optionally substituted linear or branched ($C_1$–$C_{10}$) alkyl;
   $R_3$ is optionally substituted linear or branched ($C_1$–$C_{20}$) alkyl, optionally substituted ($C_3$–$C_{20}$) cycloalkyl, or optionally substituted ($C_6$–$C_{20}$) aryl;
   $R_4$ and $R_5$ are independently hydrogen, optionally substituted linear or branched ($C_1$–$C_{20}$) alkyl; or optionally substituted ($C_6$–$C_{20}$) aryl; and $R_6$ is hydrogen, optionally substituted linear or branched ($C_1$–$C_{20}$) alkyl; or optionally substituted ($C_6$–$C_{20}$) aralkyl.

3. The photoresist composition according to claim 2, wherein said compound of Chemical Formula 2 is selected from the group consisting of compounds of Chemical Formulas 2a to 2c:

<Chemical Formula 2a>

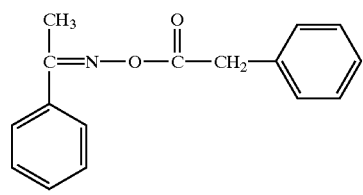

<Chemical Formula 2b>

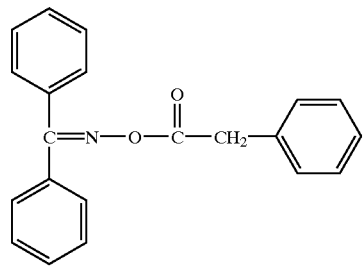

<Chemical Formula 2c>

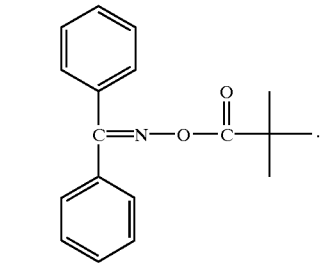

4. The photoresist composition according to claim 2, wherein R' is an aryl substituted with one or two nitro groups in ortho position(s).

5. The photoresist composition according to claim 2, wherein said compound of Formula 1 is selected from the group consisting of:

Formula 1a

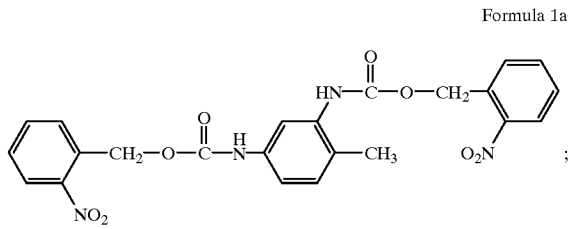

Formula 1b

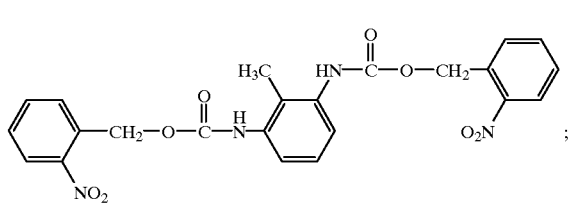

Formula 1c

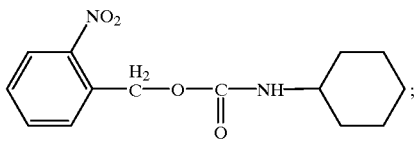

Formula 1d

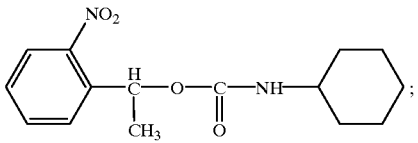

Formula 1e

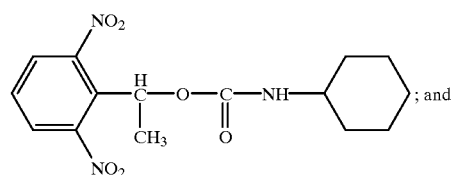

; and

Formula 1f

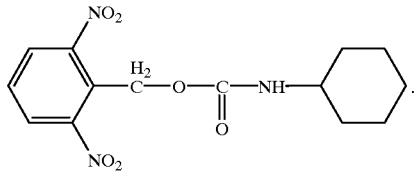

6. The photoresist composition according to claim 1, wherein said photoacid generator is a sulfide or onium compound.

7. The photoresist composition according to claim 1, wherein said photo acid generator comprises a compound selected from the group consisting of diphenyl iodide hexafluorophosphate, diphenyl iodide hexafluoroarsenate, diphenyliodide hexafluoroantimonate, diphenyl p-methoxyphenyl triflate, diphenyl p-tert-butylphenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, triphenylsulfonium triflate, dibutyl-naphthysulfonium triflate, and mixtures thereof.

8. The photoresist composition according to claim 1, wherein the amount of said photo acid generator is in the range from 0.05 to 10% by weight of said photoresist resin.

9. The photoresist composition according to claim 1, wherein the amount of said photo base generator is in the range from 30 to 150% by weight of said photo acid generator.

10. The photoresist composition according to claim 1, wherein said organic solvent is selected from a group consisting of propylene glycol methyl ether acetate, methyl 3-methoxypropionate, ethyl 3-ethoxypropionate, cyclohexanone, 2-heptanone, and mixture thereof.

11. The photoresist composition according to claim 1, wherein said organic solvent comprises from about 200 to 800% by weight of said photoresist resin.

12. A process for forming a photoresist pattern, comprising the steps of:
 (a) coating a photoresist composition of claim 1 on a substrate to form a photoresist film;
 (b) exposing said photoresist film to light by using an exposer; and
 (c) developing said exposed photoresist film.

13. The process according to claim 12, further comprising a baking step before and/or after said exposure step (b).

14. The process according to claim 13, wherein said baking step is performed at 70 to 200° C.

15. The process according to claim 12, wherein said exposer is selected from the group consisting of ArF, KrF, VUV, EUV, E-beam, X-ray and ion-beam.

16. The process according to claim 12, wherein said step of exposing the photoresist film comprises irradiating said photoresist film using the exposer at an exposure energy level of from 1 to 100 mJ/cm$^2$.

17. A semiconductor element produced by the process according to claim 12.

* * * * *